United States Patent
Uematsu

(10) Patent No.: US 12,068,805 B2
(45) Date of Patent: Aug. 20, 2024

(54) SIGNAL TRANSMISSION DEVICE AND SIGNAL TRANSMISSION CIRCUIT

(71) Applicant: Hitachi Astemo, Ltd., Hitachinaka (JP)

(72) Inventor: Yutaka Uematsu, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 125 days.

(21) Appl. No.: 17/917,631

(22) PCT Filed: Feb. 26, 2021

(86) PCT No.: PCT/JP2021/007450
§ 371 (c)(1),
(2) Date: Oct. 7, 2022

(87) PCT Pub. No.: WO2021/205775
PCT Pub. Date: Oct. 14, 2021

(65) Prior Publication Data
US 2023/0179255 A1    Jun. 8, 2023

(30) Foreign Application Priority Data

Apr. 10, 2020 (JP) .................................. 2020-070830

(51) Int. Cl.
*H04B 3/56* (2006.01)
*H01G 4/40* (2006.01)
(Continued)

(52) U.S. Cl.
CPC ................ *H04B 3/56* (2013.01); *H01G 4/40* (2013.01); *H03H 7/075* (2013.01); *H04B 3/548* (2013.01)

(58) Field of Classification Search
CPC . H04B 3/56; H04B 3/548; H01G 4/40; H03H 7/075; H03H 7/46; H05K 1/181;
(Continued)

(56) References Cited

U.S. PATENT DOCUMENTS 7,890,053 B2 * 2/2011 Washiro ................... H04B 5/48
343/858
10,581,643 B1 * 3/2020 Rajagopal ............... H04L 12/10
(Continued)

FOREIGN PATENT DOCUMENTS

JP      2013-030718 A      2/2013

OTHER PUBLICATIONS

Automotive 2-MP Camera Module Reference Design With MIPI CSI-2 Video Interface, FPD-Link III and Poc. TI Designs, TI Designs: TIDA-01130, Texas Instruments, Nov. 2017, pp. 1-28, [retrieved on Apr. 27, 2021], Internet <URL: https://www.ti.com/lit/ug/tidud51a/tidud51a.pdf?ts=161 9507567788>.
(Continued)

*Primary Examiner* — Emmanuel Bayard
(74) *Attorney, Agent, or Firm* — Foley & Lardner LLP

(57) ABSTRACT

A signal transmission device includes a signal side electrode; a first signal line connected to one side of the signal side electrode; a second signal line connected to the other side of the signal side electrode; a power source side electrode that forms a pair with the signal side electrode and is connected to the signal side electrode via an electronic component including at least an inductor component; and a capacitive coupling part that capacitively couples the power source side electrode to a ground wiring or a power source wiring. The first signal line, the signal side electrode, and the second signal line form a transmission path for transmitting an electric signal. The first signal line and the second signal line transmit power via the signal side electrode, the electronic component, and the power source side electrode.

12 Claims, 17 Drawing Sheets

(51) Int. Cl.
*H03H 7/075* (2006.01)
*H04B 3/54* (2006.01)

(58) Field of Classification Search
CPC ... H05K 1/0233; H05K 1/0245; H05K 1/0253
USPC .......................................................... 375/258
See application file for complete search history.

(56) References Cited

U.S. PATENT DOCUMENTS

| | | | |
|---|---|---|---|
| 2013/0187445 A1 | 7/2013 | Mutzabaugh | |
| 2014/0142768 A1* | 5/2014 | Uramoto | H02J 50/80 |
| | | | 700/286 |
| 2017/0174131 A1 | 6/2017 | Sigle | |
| 2019/0036370 A1* | 1/2019 | Kanno | H02J 50/12 |
| 2019/0056444 A1* | 2/2019 | Dragoi | G01R 31/006 |
| 2019/0216524 A1* | 7/2019 | Ikeda | H02J 50/20 |
| 2019/0386630 A1* | 12/2019 | Higuchi | H03H 7/09 |
| 2020/0225779 A1* | 7/2020 | Katsurahira | G06F 3/03545 |
| 2020/0343214 A1* | 10/2020 | Seki | H01L 23/66 |
| 2022/0060342 A1* | 2/2022 | Someya | H04L 12/40045 |
| 2022/0376562 A1* | 11/2022 | Oda | B60N 2/0264 |
| 2023/0156910 A1* | 5/2023 | Kikuchi | H01P 3/085 |
| | | | 174/250 |

OTHER PUBLICATIONS

Uematsu, Yutaka et al. High Bandwidth and Multi-Channel Power over Coaxial Filters for Automotive Low-Voltage Differential Signaling Interconnect. 2020 IEEE 70th Electronic Components and Technology Conference (ECTC), Jun. 3, 2020, pp. 1749-1756.
International Search Report with English Translation and Written Opinion dated May 18, 2021, in corresponding International Application No. PCT/JP2021/007450.

* cited by examiner (A)           (B)

(A)

(B)

(A)

(B)

(A)

(B)

(C)

(A)

(B)

SIGNAL TRANSMISSION DEVICE AND SIGNAL TRANSMISSION CIRCUIT

TECHNICAL FIELD

The present invention relates to a signal transmission device and a signal transmission circuit.

BACKGROUND ART

According to Patent Literature 1, a monitoring circuit and a camera circuit are connected via a coaxial cable, and a signal and power are superimposed on the coaxial cable and transmitted. In a path of a signal line, a DC cut-off capacitor is arranged in the immediate vicinity of a transmission/reception IC. An active filter is inserted into a power source wiring at a connection point with the signal line, so that a signal and power are separated according to the filter frequency range.

CITATION LIST

Patent Literature

PTL 1: US Patent Application Publication No. 2013/0187445

SUMMARY OF INVENTION

Technical Problem

It has been difficult to widen the filter frequency range to a high frequency side.

Solution to Problem

A signal transmission device according to a first aspect of the present invention includes: a signal side electrode; a first signal line connected to one side of the signal side electrode; a second signal line connected to the other side of the signal side electrode; a power source side electrode that forms a pair with the signal side electrode and is connected to the signal side electrode via an electronic component including at least an inductor component; and a capacitive coupling part that capacitively couples the power source side electrode to a ground wiring or a power source wiring, in which it is preferable that the first signal line, the signal side electrode, and the second signal line form a transmission path for transmitting an electric signal, and the first signal line and the second signal line transmit power via the signal side electrode, the electronic component, and the power source side electrode.

A signal transmission device according to a second aspect of the present invention includes: a first electrode; a first signal line connected to one side of the first electrode; a second signal line connected to the other side of the first electrode; a second electrode; a third signal line connected to one side of the second electrode; a fourth signal line connected to the other side of the second electrode; a third electrode and a fourth electrode that form a pair with the first electrode and the second electrode and are connected to the first electrode and the second electrode via an electronic component including at least an inductor component; a first capacitive coupling part that capacitively couples the third electrode to a ground wiring or a power source wiring; and a second capacitive coupling part that capacitively couples the fourth electrode to the ground wiring or the power source wiring, in which it is preferable that the first signal line and the second signal line constitute a first differential wiring, the third signal line and the fourth signal line constitute a second differential wiring, the first differential wiring and the first electrode, and the second differential wiring and the second electrode form a transmission path for transmitting an electric signal, and the first differential wiring and the second differential wiring transmit power from the third electrode and the fourth electrode via the first electrode and the second electrode.

Advantageous Effects of Invention

According to the present invention, it is possible to widen a filter frequency range to a high frequency side.

Problems, configurations, and effects other than those described above will be clarified by the following description of embodiments for carrying out the invention.

DESCRIPTION OF EMBODIMENTS

Figure 1:
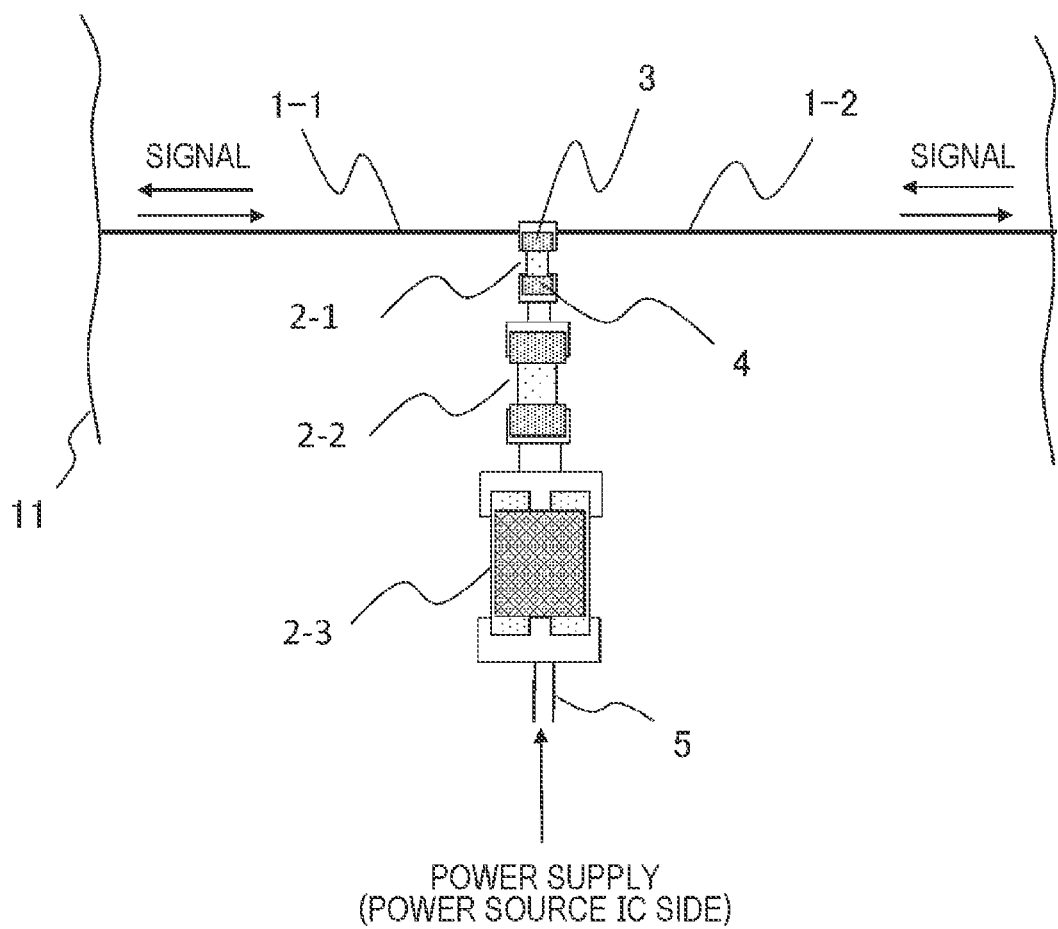
FIG. 1 is a configuration diagram of a signal transmission device in a comparative example.

Hereinafter, embodiments of the present invention will be described with reference to the drawings. The following description and drawings are examples for describing the present invention, and omission and simplification are made as appropriate for the sake of clarity of description. The present invention can be carried out in various other forms. Unless otherwise specified, each component may be singular or plural.

Positions, sizes, shapes, ranges, and the like of components illustrated in the drawings may not represent actual positions, sizes, shapes, ranges, and the like in order to facilitate understanding of the invention. Therefore, the present invention is not necessarily limited to the positions, sizes, shapes, ranges, and the like disclosed in the drawings.

In a case where there is a plurality of components having the same or similar functions, the same reference signs may be attached with different subscripts for description. However, in a case where it is not necessary to distinguish the plurality of components, the description may be made while omitting the subscripts.

Comparative Example

Before describing the present embodiment, a comparative example to be compared with the present embodiment will be described.

FIG. 1 is a configuration diagram of a signal transmission device in the comparative example. The signal transmission device branches at the center of a signal line 1-1 on the left side in the drawing and a signal line 1-2 on the right side in the drawing, and is connected to a power source wiring 5 via a signal/power source separation filter including filter components 2-1 to 2-3. The signal lines 1-1 and 1-2 form a transmission path for transmitting an electric signal, and are connected to a device such as a communication LSI. The filter component 2-1 is formed by arranging a PoC filter component between a signal side electrode 3 and a power source side electrode 4. PoC stands for Power over Coaxial cable. The PoC filter component is an electronic component including at least an inductor component. The filter components 2-2 and 2-3 have a similar configuration, but often have a configuration using PoC filter components having different sizes and characteristics. The signal side electrode 3 of the filter component 2-1 is connected to the signal lines 1-1 and 1-2. The power source side electrode 4 of the filter component 2-1 is connected to the power source wiring 5 via the filter components 2-2 and 2-3.

Figure 2:
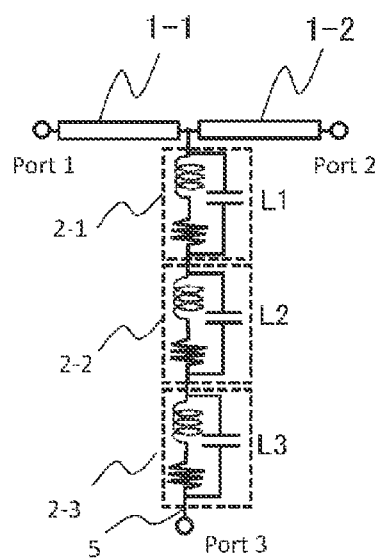
FIGS. 2(A) and 2(B) are diagrams illustrating an equivalent circuit and an impedance profile of the signal transmission device in the comparative example.
Figure 2:
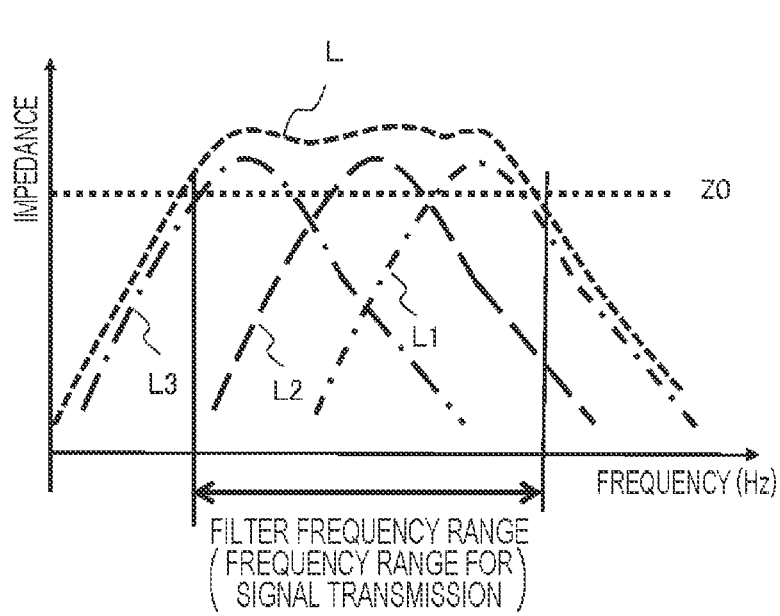

FIG. 2(A) illustrates an equivalent circuit of the signal transmission device. FIG. 2(B) illustrates an impedance profile of the signal transmission device. In FIG. 2(B), the horizontal axis represents frequency, and the vertical axis represents impedance.

As illustrated in FIG. 2(A), the filter components are not a simple inductance but are expressed by a circuit having a resistance component in series to an inductance and a parasitic capacitance component in parallel to the inductance. That is, the filter components 2-1 to 2-3 are a parallel LC circuit. As illustrated in FIG. 2(B), the impedance profile has a mountain type impedance profile that takes a maximum value of the impedance at an anti-resonance frequency determined by the inductance L and the capacitance C. Impedance profiles of the filter components 2-1 to 2-3 are L1 to L3, respectively, and a combined impedance profile of the signal/power source separation filter is L.

The role of the signal/power source separation filter is to prevent energy from being transmitted to the power source wiring 5 side by inserting a component having a sufficiently high impedance with respect to the signal line 1 into a connection point with the power source wiring 5. As a function of the signal/power source separation filter, it is necessary to set the filter frequency range (signal transmission frequency range) in which the energy of the signal exists to a reference impedance ZO or more. On the other hand, since the impedance of a single filter component cannot cover a wide frequency range, the filter frequency range is expanded by using a plurality of components having different anti-resonance frequencies. FIG. 2(B) illustrates an example in which the filter frequency range is expanded by using the three filter components 2-1 to 2-3. Providing the filter component 2-1 having the highest anti-resonance frequency at the connection point with the signal lines 1-1 and 1-2 plays a role of preventing high-frequency energy from leaking.

However, in this comparative example, in order to widen the filter frequency range to the high frequency side, it is necessary to use a component having a high anti-resonance frequency, but due to the structure of the filter components 2-1 to 2-3, there is a limit to increasing the anti-resonance frequency, and for example, it is difficult to configure a filter covering up to a filter frequency range of 10 GHz level.

According to each embodiment described below, in such a signal transmission device, for example, it is possible to provide a structure in which a signal/power source separation filter corresponding to a high-speed signal at a speed exceeding 10 Gbps is formed on a printed wiring board at low cost.

First Embodiment

Figure 3:
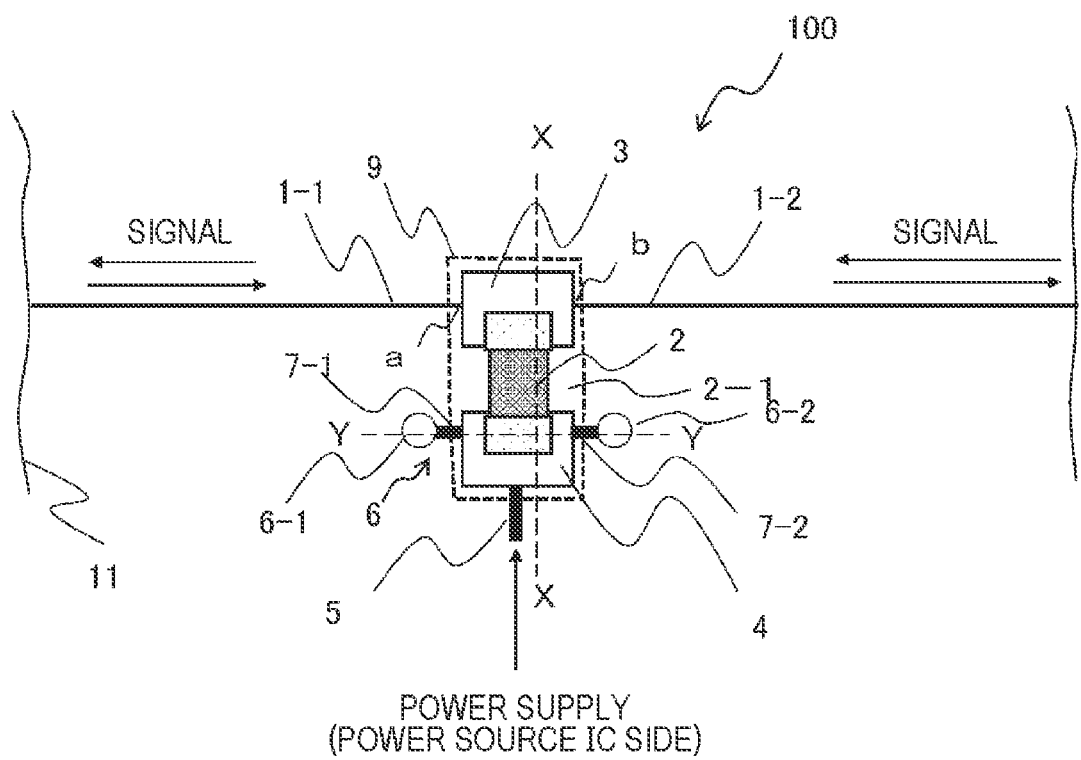
FIG. 3 is a diagram illustrating a configuration of a signal transmission device according to a first embodiment.

FIG. 3 is a diagram illustrating a configuration of a signal transmission device 100 according to a first embodiment.

As illustrated in FIG. 3, signal lines 1-1 and 1-2 are formed on a substrate 11 by printed wiring. The signal lines 1-1 and 1-2 form a transmission path for transmitting an electric signal, and are connected to a device such as a communication LSI. A filter component 2-1 constituting a signal/power source separation filter is connected between the signal line 1-1 and the signal line 1-2, and is further connected to a power source wiring 5 via the filter component 2-1. The power source wiring 5 is connected to a power source IC (not illustrated). In the present embodiment and the following embodiments, in order to simplify the description, only the filter component 2-1 may be illustrated as the signal/power source separation filter, but the filter components 2-2 to 2-3 and the like illustrated in the comparative example may be included as necessary.

The filter component 2-1 includes a signal side electrode 3 and a power source side electrode 4 that forms a pair with the signal side electrode 3 and is connected to the signal side electrode 3 via an electronic component 2 including at least an inductor component. The signal line 1-1 is connected to one side of the signal side electrode 3, and the signal line 1-2 is connected to the other side of the signal side electrode 3. Electrode patterns 6-1 and 6-2 are connected to the power source side electrode 4 on both sides of the power source side electrode 4 via wiring patterns 7-1 and 7-2 thinner than the electrode patterns 6-1 and 6-2, respectively.

The signal lines 1-1 and 1-2 are connected to the power source wiring 5 via the signal side electrode 3, the electronic component 2, and the power source side electrode 4. As a result, power for a power source output from the power source IC is transmitted to the transmission signal lines 1-1 and 1-2 via the power source wiring 5, the power source side electrode 4, the signal side electrode 3, and the electronic component 2, and is supplied to a device such as an LSI at a connection destination thereof via the transmission signal lines 1-1 and 1-2. That is, the transmission signal lines 1-1 and 1-2 transmit power between the power source IC and the device at the connection destination via the signal side electrode 3, the electronic component 2, and the power source side electrode 4.

The filter component 2-1 including the signal side electrode 3, the electronic component 2, and the power source side electrode 4 is disposed on the substrate 11 in a removal portion 9 from which a ground wiring is removed. On the other hand, the electrode patterns 6-1 and 6-2 provided on both sides of the power source side electrode 4 are arranged to face the ground wiring 8-1 (see FIG. 4) of the substrate 11. That is, the electrode patterns 6-1 and 6-2 function as a capacitive coupling part 6 that capacitively couples the power source side electrode 4 to the ground wiring 8-1. In other words, the capacitive coupling part 6 includes a first capacitive coupling part (electrode pattern 6-1) and a second capacitive coupling part (electrode pattern 6-2). The first capacitive coupling part is provided on the outer side of the connection point a between the signal side electrode 3 and the signal line 1-1, and capacitively couples the power source side electrode 4 to the ground wiring 8-1. The second capacitive coupling part is provided on the outer side of the connection point b between the signal side electrode 3 and the signal line 1-2, and capacitively couples the power source side electrode 4 to the ground wiring 8-1.

Figure 4:
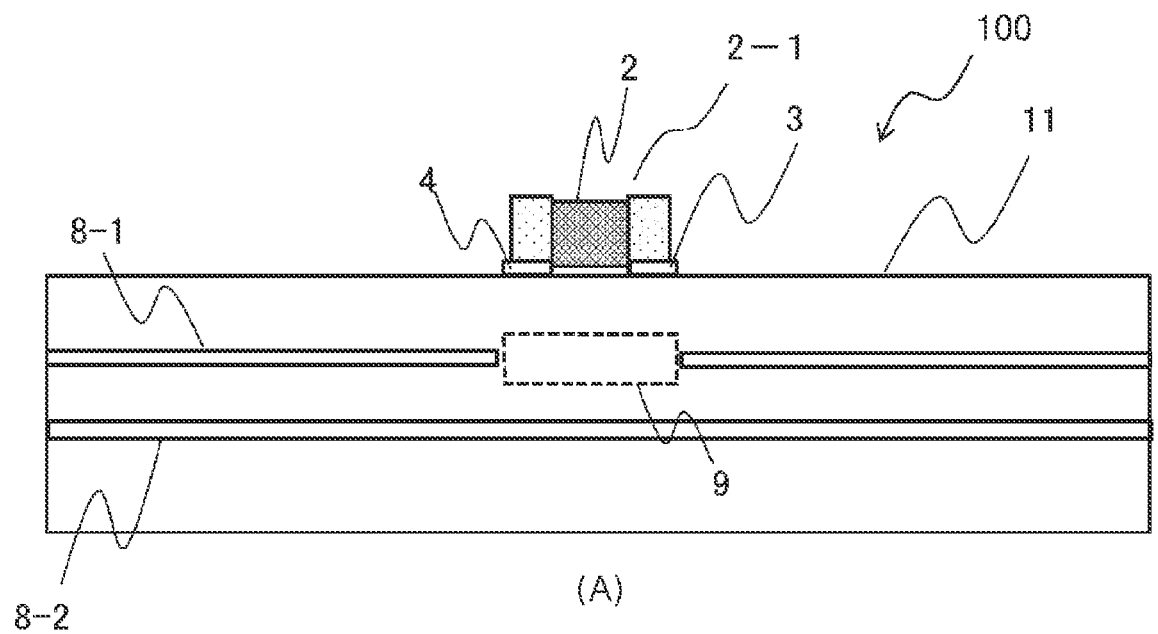
FIGS. 4(A) and 4(B) are cross-sectional views of a printed circuit board in a state where a filter component is disposed on a substrate according to the first embodiment.
Figure 4:
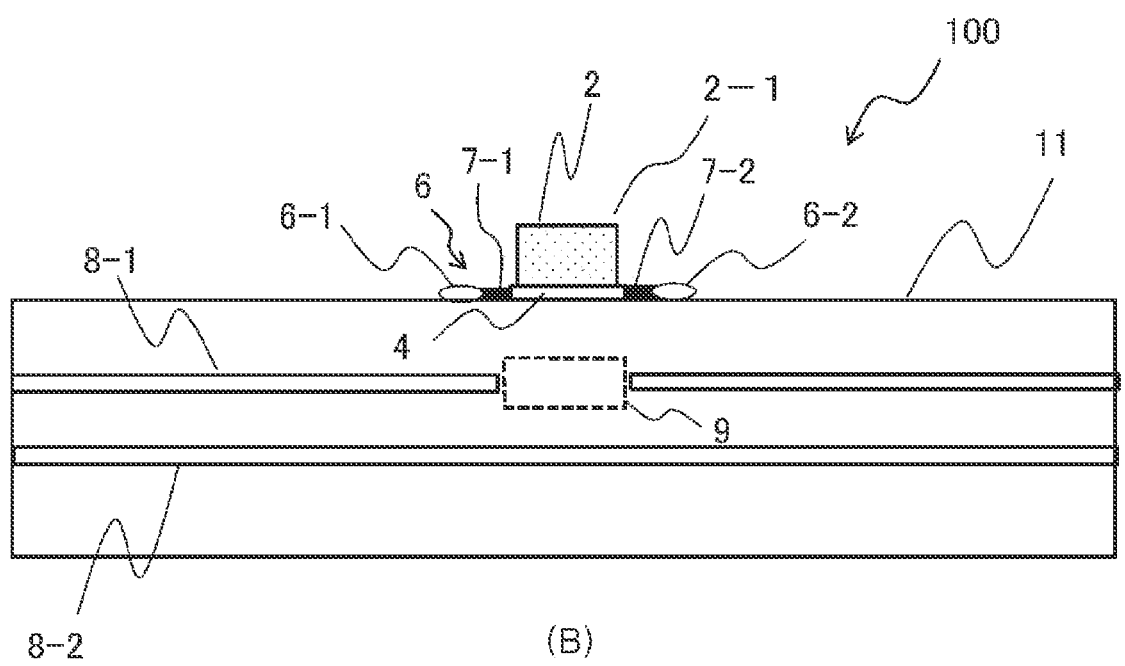

FIG. 4 are cross-sectional views of a state in which the filter component 2-1 is disposed on the substrate 11, FIG. 4(A) is a side view thereof, and FIG. 4(B) is a rear view thereof. FIG. 4(A) is a cross-sectional view taken along line X-X in FIG. 3, and FIG. 4(B) is a cross-sectional view taken along line Y-Y in FIG. 3.

The substrate 11 is a multilayer wiring substrate, the surface layer of the substrate 11 is a surface on which the filter component 2-1 is mounted, and the ground wiring layer 8-1 is present immediately below the surface layer. FIG. 4(A) illustrates an example in which a ground wiring layer 8-2 is provided below the ground wiring layer 8-1, but this layer may be a signal layer. As illustrated in FIG. 4(A), the removal portion 9 from which the ground wiring is removed is provided immediately below the signal side electrode 3, the electronic component 2, and the power source side electrode 4 so as not to generate unnecessary parasitic capacitance.

On the other hand, as illustrated in FIG. 4(B), the ground wiring layer 8-1 exists immediately below the electrode patterns 6-1 and 6-2 provided on both sides of the power source side electrode 4. That is, the electrode patterns 6-1 and 6-2 function as the capacitive coupling part 6 by forming a parallel flat plate with the ground wiring layer 8-1.

Figure 5:
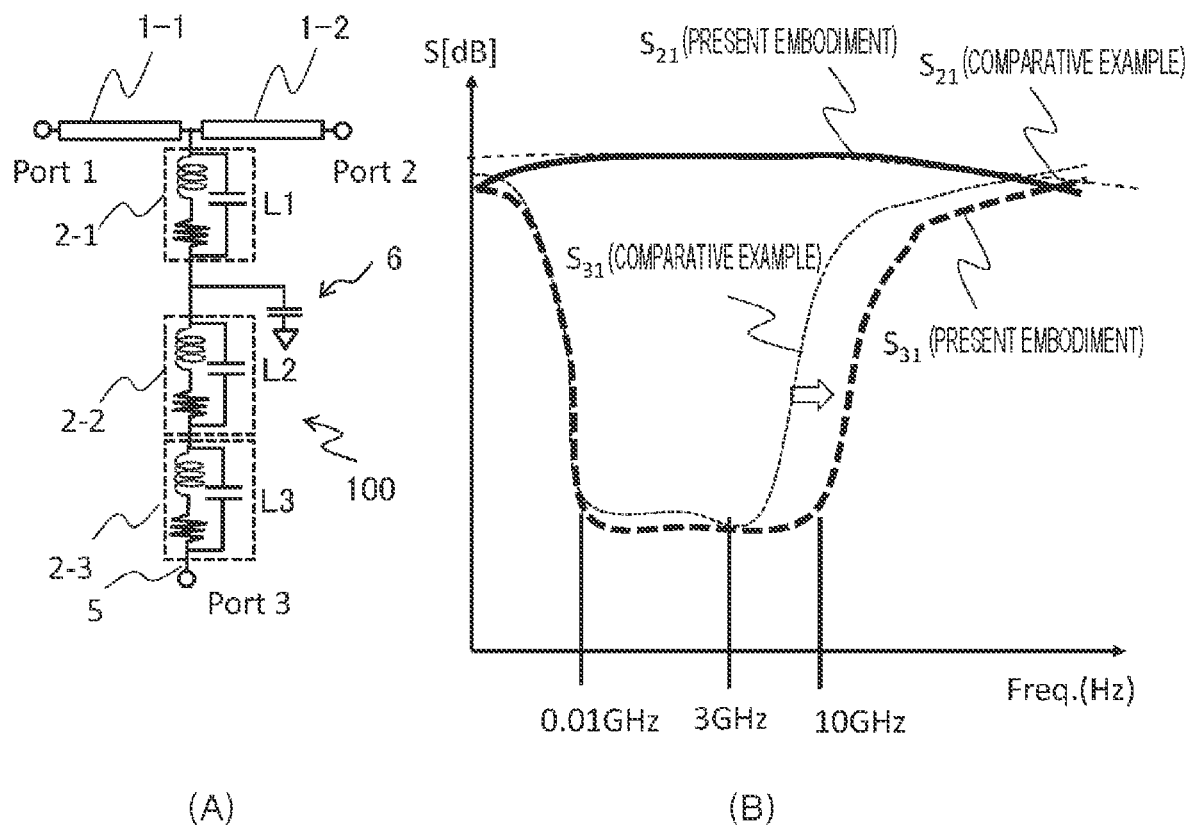
FIGS. 5(A) and 5(B) are diagrams illustrating an equivalent circuit of the signal transmission device and an S parameter profile of the signal transmission device according to the first embodiment.

FIG. 5(A) illustrates an equivalent circuit of the signal transmission device 100. FIG. 5(B) illustrates an S parameter profile of the signal transmission device 100. In FIG. 5(B), the horizontal axis represents frequency, and the vertical axis represents an S parameter.

In the present embodiment, as illustrated in FIG. 5(A), the capacitive coupling part 6 is added to the power source side electrode 4 of the first-stage filter component 2-1. As a result, the inflow of a high-frequency current leaking to the power source side via the parasitic capacitance of the filter component 2-1 is prevented, so that the filter performance is widened in band.

According to the present embodiment, as illustrated in FIG. 5(B), by adding the capacitive coupling part 6 to the power source side electrode 4 of the first-stage filter component 2-1, a signal passing characteristic ($S_{21}$) has little effect as compared with the comparative example. A filter characteristic ($S_{31}$) can be expanded to a high frequency filter frequency range as compared with the comparative example.

Figure 6:
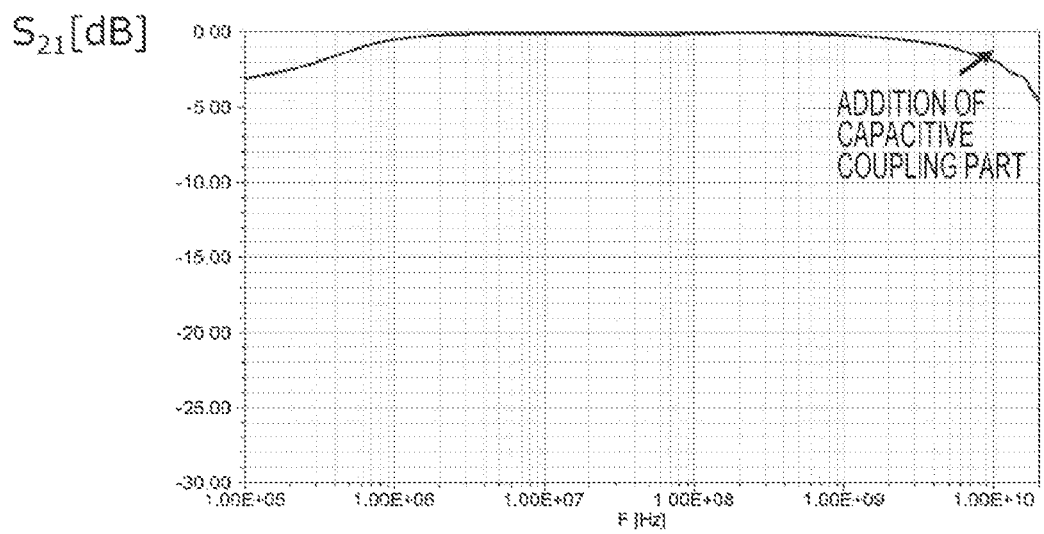
FIGS. 6(A) and 6(B) are diagrams illustrating a signal passing characteristic ($S_{21}$) and a filter characteristic ($S_{31}$) in the first embodiment.
Figure 6:
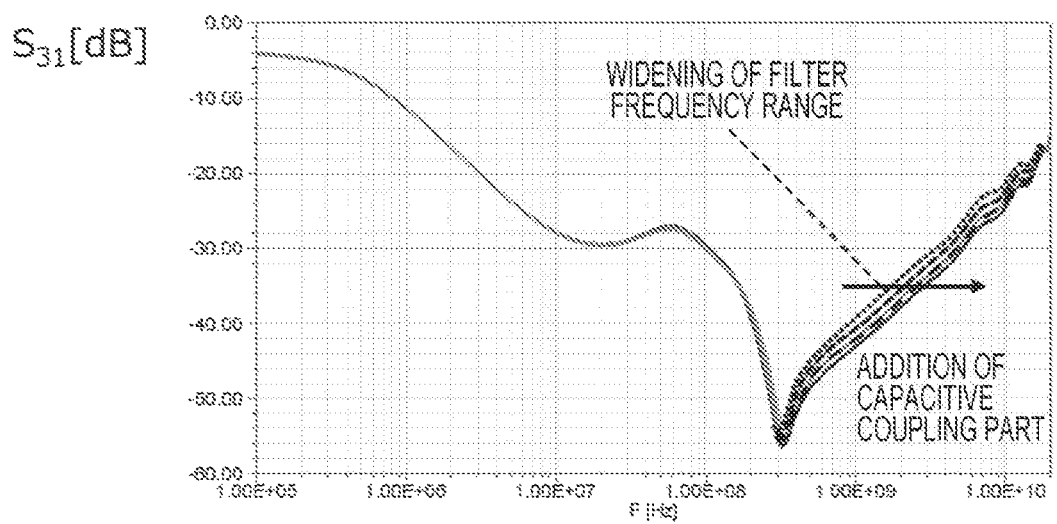

FIG. 6(A) is a diagram illustrating the signal passing characteristic ($S_{21}$) and FIG. 6(B) is a diagram illustrating the filter characteristic ($S_{31}$).

According to the present embodiment, as illustrated in FIG. 6(A), since the capacitive coupling part 6 is added to the power source side electrode 4 of the first-stage filter component 2-1, the signal passing characteristic ($S_{21}$) has little effect. As illustrated in FIG. 6(B), a tendency that the filter characteristic ($S_{31}$) is improved can be confirmed.

Figure 7:
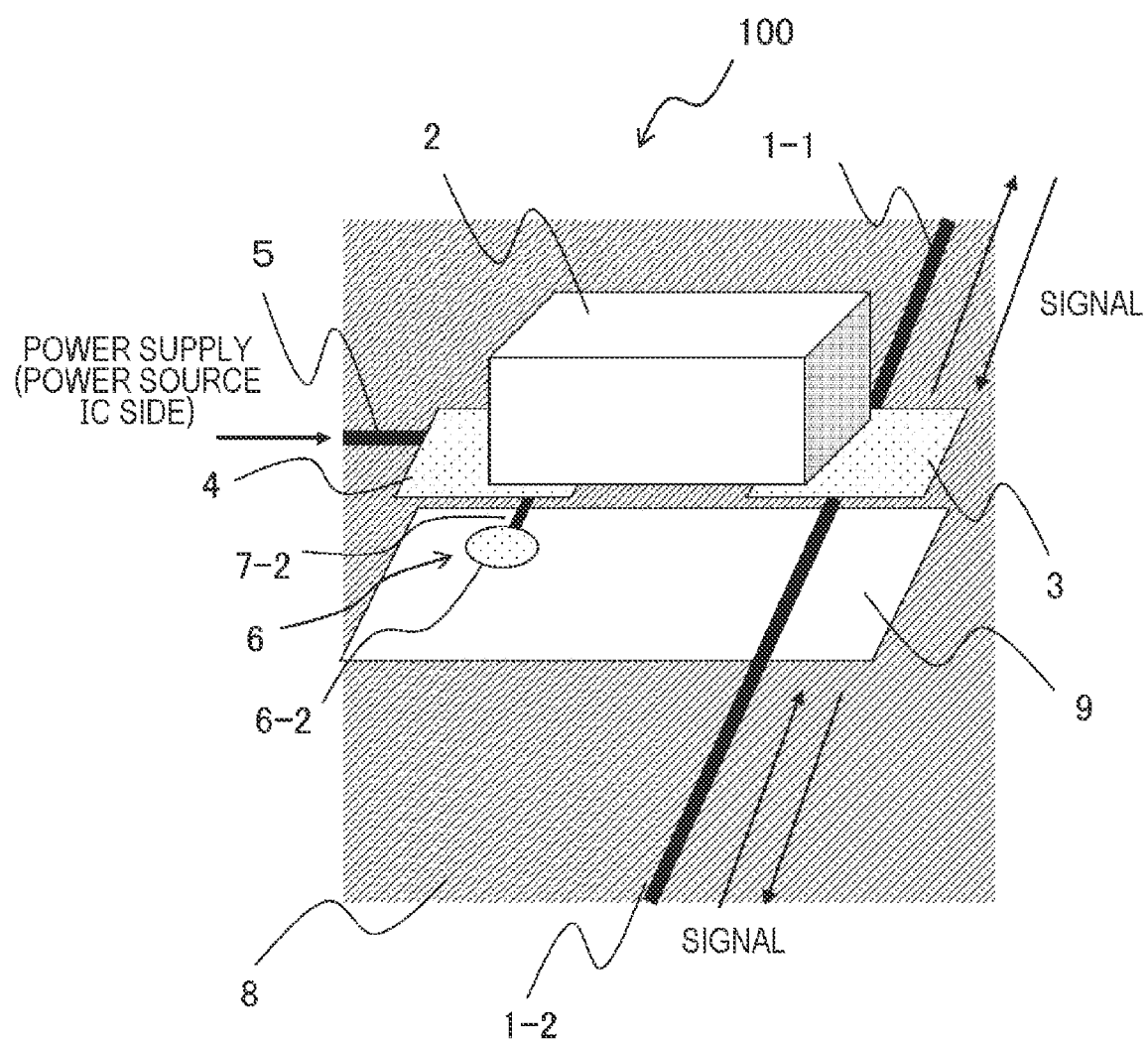
FIG. 7 is a perspective view illustrating the signal transmission device according to the first embodiment.

FIG. 7 is a perspective view illustrating the signal transmission device 100 according to the present embodiment.

As illustrated in FIG. 7, the electrode patterns 6-1 and 6-2 face the ground wiring 8 to form a parallel plate capacitor, thereby implementing the capacitive coupling part 6. Although the electrode pattern 6-1 is not illustrated, the electrode patterns 6-1 and 6-2 are connected to both sides of the power source side electrode 4 via the wiring patterns 7-1 and 7-2 thinner than the electrode patterns 6-1 and 6-2, respectively. The capacity to be added by providing the capacitive coupling part 6 is about 0.1 pF to several pF, which contributes to improvement of filter performance in the 10 GHz band. Further, the positions of the electrode patterns 6-1 and 6-2 are desirably close to the signal lines 1-1 and 1-2, respectively. Further, the electrode patterns 6-1 and 6-2 provided on both sides of the power source side electrode 4 are desirably symmetrical. Reasons for these arrangements will be described in a second embodiment including results of electromagnetic field analysis.

According to the present embodiment, the filter frequency range can be widened to the high frequency side, and moreover, the capacitive coupling part 6 can be configured only with the pattern wiring of the substrate 11, and since the pattern wiring is very small, there is little effect on the area of the substrate 11, and no additional cost is required.

Second Embodiment

Figure 8:
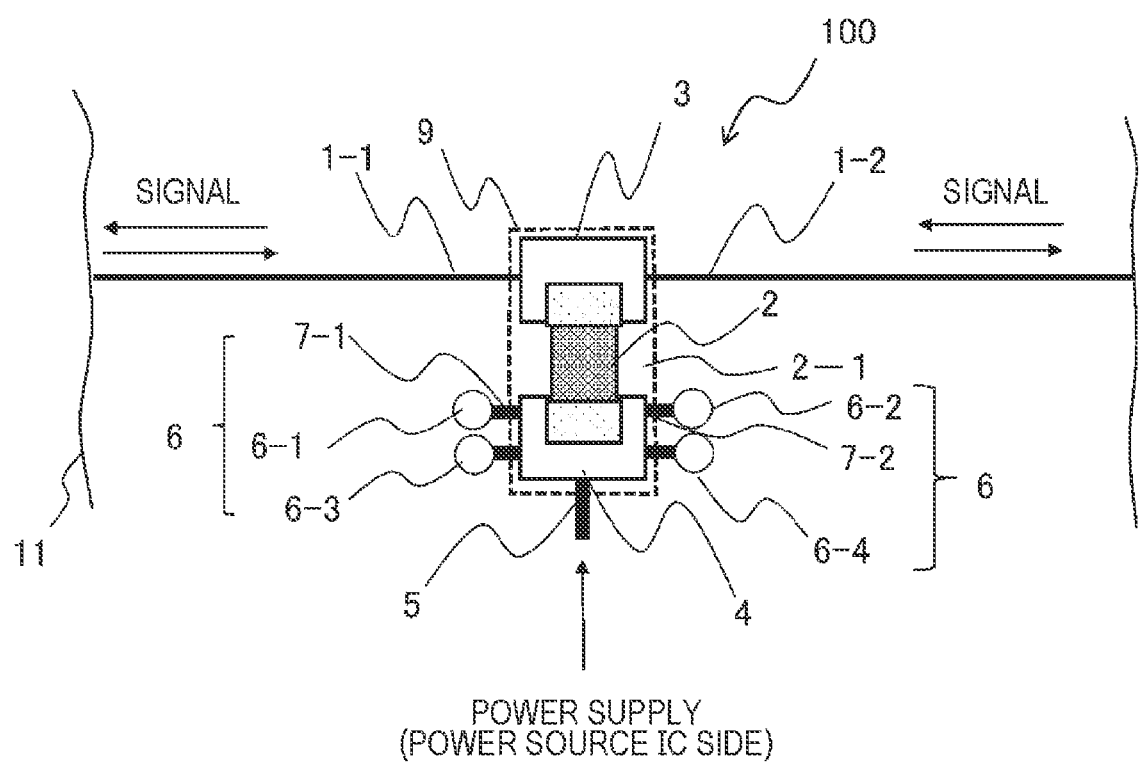
FIG. 8 is a diagram illustrating a configuration of a signal transmission device according to a second embodiment.
Figure 9:
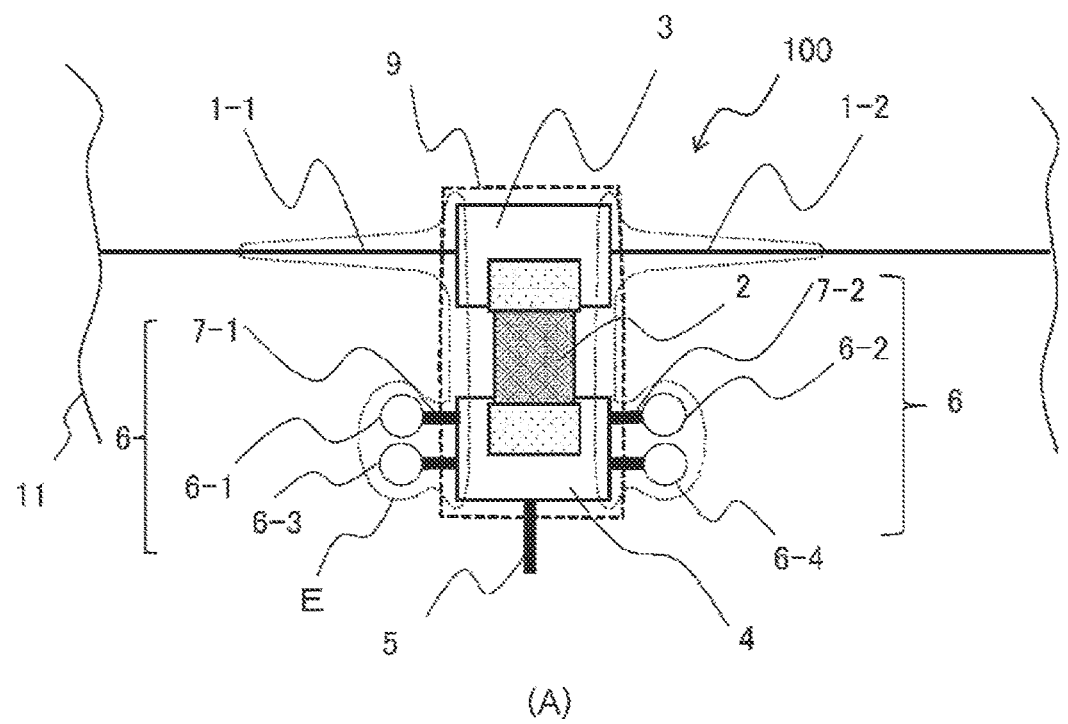
FIGS. 9(A), 9(B), and 9(C) are a diagram illustrating a change in an electric field of the signal transmission device according to the second embodiment, and diagrams illustrating a signal passing characteristic ($S_{21}$) and a filter characteristic ($S_{31}$).
Figure 9:
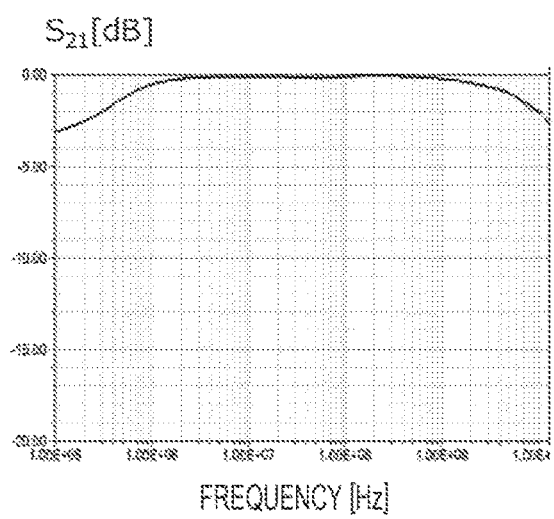
Figure 9:
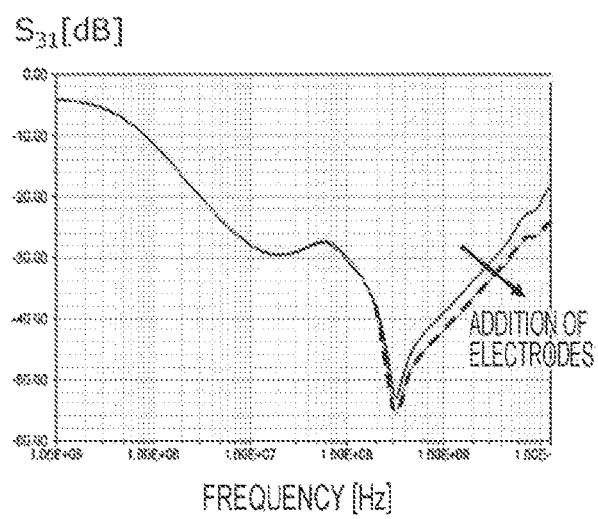

The second embodiment will be described with reference to FIGS. 8 and 9. The same portions as those of the first embodiment are denoted by the same reference signs, and the description thereof will be omitted. In the first embodiment, the electrode patterns 6-1 and 6-2 are provided on both sides of the power source side electrode 4, but in the second embodiment, electrode patterns 6-1, 6-2, 6-3, and 6-4 are provided on both sides of a power source side electrode 4. This can further improve the filter performance.

When the size of the electrode pattern of the capacitive coupling part 6 is increased in order to improve characteristics in a high frequency region, resonance occurs according to the size of the electrode pattern, and thus it is desirable to provide a plurality of small electrode patterns. Therefore, in the second embodiment, as illustrated in FIG. 8, a total of the four electrode patterns 6-1, 6-2, 6-3, and 6-4 are provided, two on each of the left and right sides of the power source side electrode 4. Then, the electrode patterns 6-1, 6-2, 6-3, and 6-4 face a ground wiring 8-1 (see FIG. 4) to form a parallel plate capacitor, thereby implementing a capacitive coupling part 6. The number of electrode patterns is not limited to four, and more electrode patterns may be provided.

FIG. 9(A) is a diagram illustrating a change in an electric field when a high-frequency current flows through the signal lines 1-1 and 1-2 in the present embodiment. A change in the electric field E obtained by electromagnetic field analysis is indicated by a dotted line.

When the current flowing through the signal lines 1-1 and 1-2 reaches the signal side electrode 3, disturbance of the electric field E occurs. This is because the wiring width greatly changes due to the presence of the signal side electrode 3, and the return current becomes discontinuous because a removal portion 9 from which the ground wiring is removed is provided immediately below the signal side electrode 3 for impedance matching of the signal side electrode 3. The disturbance of the electric field E is coupled to the nearest power source side electrode 4, resulting in leakage of a high-frequency current. The capacitive coupling part 6 disposed at both ends exerts an effect in order to immediately cause the leakage current to flow to the ground wiring. Since the high-frequency currents on the signal lines 1-1 and 1-2 flow bidirectionally and coupling occurs on both sides of the power source side electrode 4, the capacitive coupling part 6 needs to be arranged symmetrically on both sides of the power source side electrode 4. In addition, due to the coupling from the signal side electrode 3, the capacitive coupling part 6 of the power source side electrode 4 is desirably located on the signal lines 1-1 and 1-2 side. For example, when the two electrode patterns 6-1 and 6-2 are present as described in the first embodiment, the electrode patterns 6-1 and 6-2 are arranged on the signal lines 1-1 and 1-2 side as illustrated in FIG. 3. Even when there is a plurality of electrode patterns, the electrode patterns are arranged as close to the signal lines 1-1 and 1-2 as possible.

FIG. 9(B) is a diagram illustrating a signal passing characteristic ($S_{21}$) and FIG. 9(C) is a diagram illustrating a filter characteristic ($S_{31}$).

According to the present embodiment, as illustrated in FIG. 9(B), since the capacitive coupling part 6 is constituted by the plurality of electrode patterns, the signal passing characteristic ($S_{21}$) has little effect. As illustrated in FIG. 9(C), a tendency that the filter characteristic ($S_{31}$) is improved can be confirmed.

Third Embodiment

Figure 10:
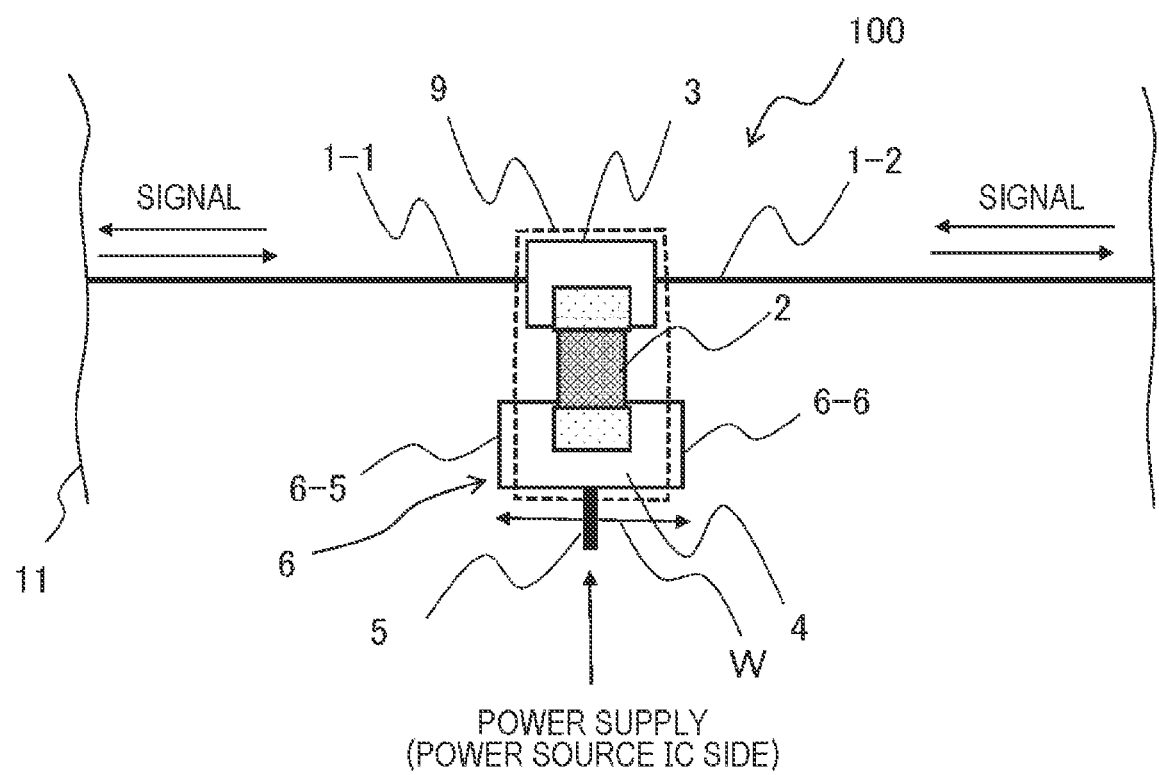
FIG. 10 is a diagram illustrating a configuration of a signal transmission device according to a third embodiment.

A third embodiment will be described with reference to FIG. 10. The same portions as those of the first embodiment are denoted by the same reference signs, and the description thereof will be omitted.

In the present embodiment, a capacitive coupling part 6 is formed by widening a width W of a power source side electrode 4. The width W of the power source side electrode 4 is made larger than a width of a removal portion 9 from which a ground wiring is removed. As a result, both ends of the power source side electrode 4 overlapping the ground wiring face the ground wiring, so that a parallel plate type capacitor is formed, and the capacitive coupling part 6 (6-5, 6-6) is formed.

A capacitance of about 0.1 to 0.3 pF can be formed only by slightly increasing the width W, for example, by about 10% of the size of the power source side electrode 4, so that a remarkable effect is obtained with a simple configuration. The signal side electrode 3 has a size that fits the width of the removal portion 9 from which the ground wiring is removed. In other words, the width W of the power source side electrode 4 is made larger than the width of the signal side electrode 3. A length of a filter component 2-1 in the longitudinal direction is the same as that in the first embodiment.

Fourth Embodiment

A fourth embodiment will be described with reference to FIG. 11. The same portions as those of the first embodiment are denoted by the same reference signs, and the description thereof will be omitted.

Figure 11:
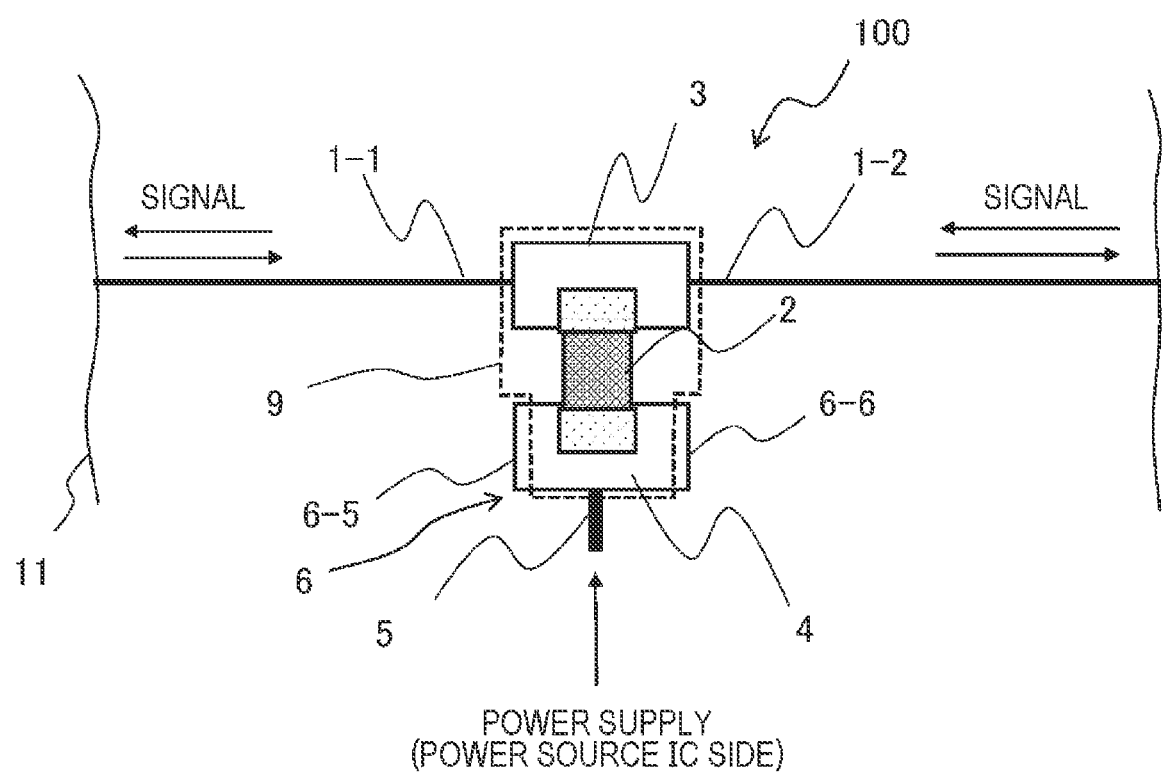
FIG. 11 is a diagram illustrating a configuration of a signal transmission device according to a fourth embodiment.

In the present embodiment, as illustrated in FIG. 11, widths of a power source side electrode 4 and a signal side electrode 3 are the same as those in the first embodiment, but a removal portion 9 that is located immediately below the power source side electrode 4 and from which a ground wiring is removed is narrower than a removal portion 9 that is located immediately below the signal side electrode 3 and from which the ground wiring is removed. As a result, both ends 6-5 and 6-6 of the power source side electrode 4 overlapping the ground wiring face the ground wiring, so that a parallel plate type capacitor is formed and a capacitive coupling part 6 is formed. The signal side electrode 3 has a size that fits the width of the removal portion 9 from which the ground wiring is removed. A length of a filter component 2-1 in the longitudinal direction is the same as that in the first embodiment.

According to the present embodiment, a remarkable effect is obtained with a simple configuration in which only the ground wiring is devised.

Fifth Embodiment

Figure 12:
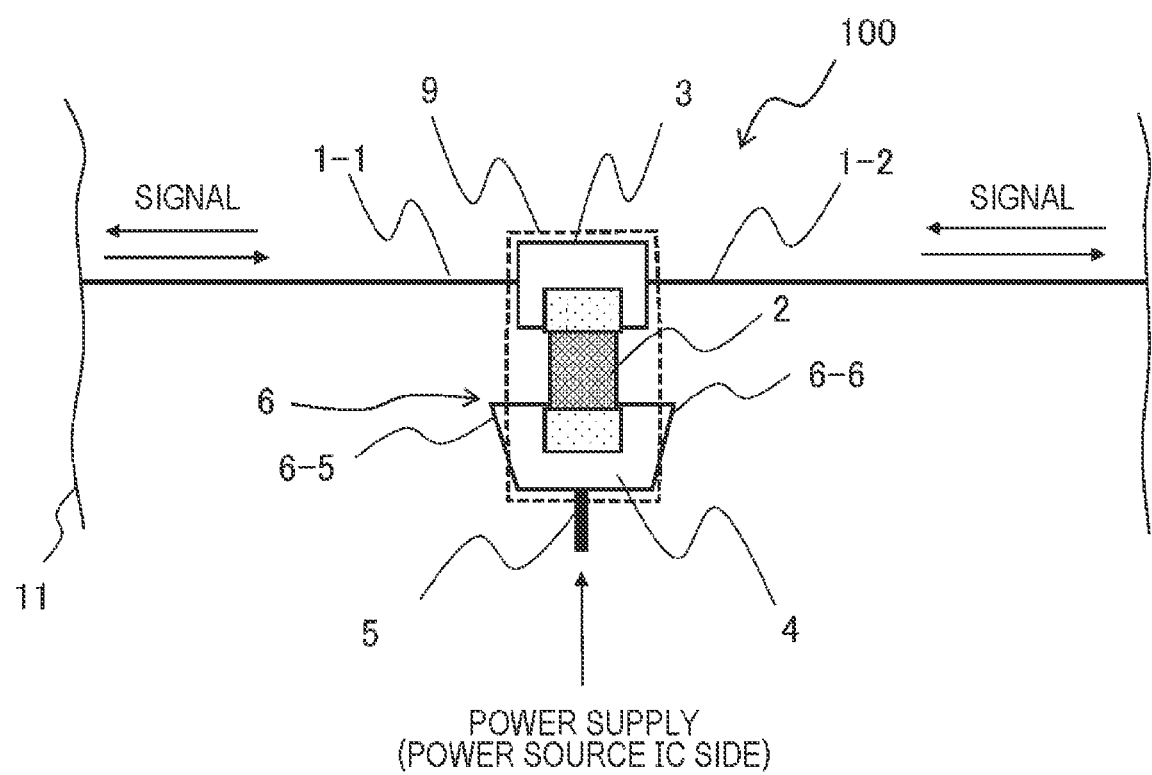
FIG. 12 is a diagram illustrating a configuration of a signal transmission device according to a fifth embodiment.

A fifth embodiment will be described with reference to FIG. 12. The same portions as those of the first embodiment are denoted by the same reference signs, and the description thereof will be omitted.

In the present embodiment, as in the third embodiment, a capacitive coupling part 6 is formed by increasing the size of a power source side electrode 4. In this case, the power source side electrode 4 has a trapezoidal shape so that the power source side electrode 4 has an area with a width that becomes larger toward the side close to signal lines 1-1 and 1-2. Widths of trapezoidal wide portions 6-5 and 6-6 of the power source side electrode 4 are made larger than a width of a removal portion 9 from which a ground wiring is removed. As a result, the wide portions 6-5 and 6-6 of the power source side electrode 4 overlapping the ground wiring face the ground wiring to form a parallel plate capacitor, thereby forming a capacitive coupling part 6.

According to the present embodiment, a remarkable effect is obtained with a simple configuration in which only the power source side electrode 4 has a trapezoidal shape.

Sixth Embodiment

Figure 13:
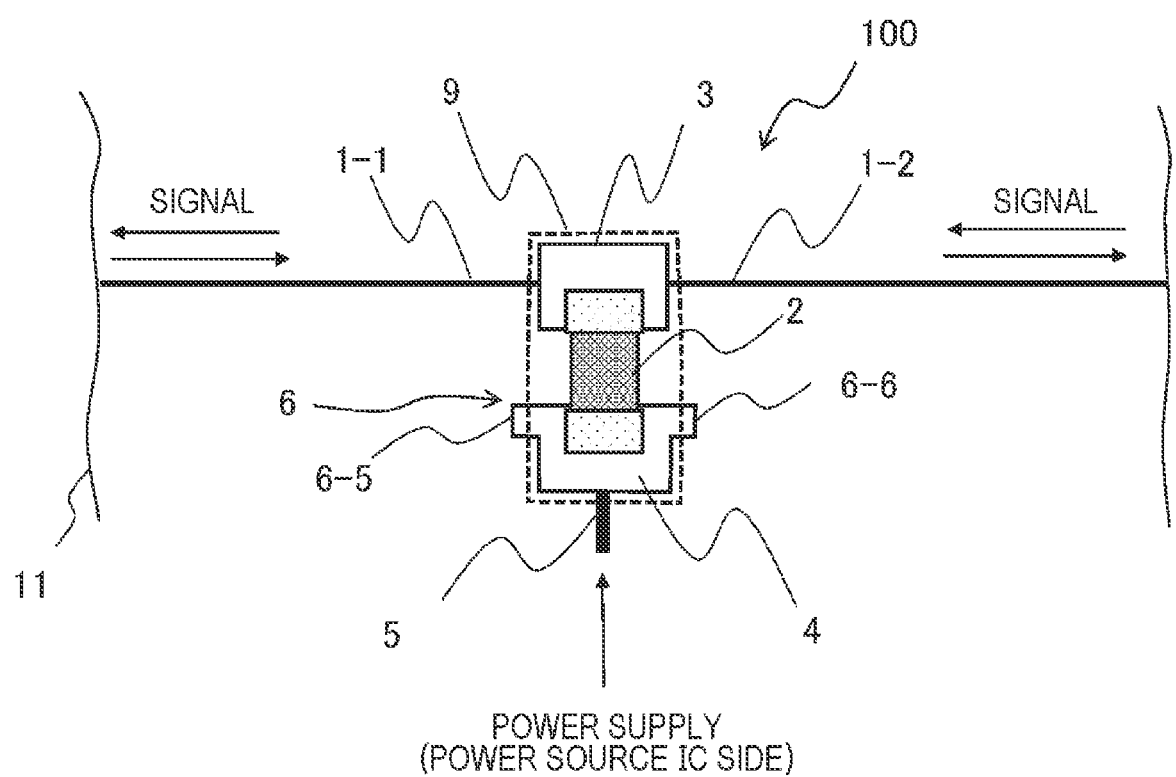
FIG. 13 is a diagram illustrating a configuration of a signal transmission device according to a sixth embodiment.

A sixth embodiment will be described with reference to FIG. 13. The same portions as those of the first embodiment are denoted by the same reference signs, and the description thereof will be omitted.

In the present embodiment, as in the third embodiment, a capacitive coupling part 6 is formed by increasing the size of a power source side electrode 4. In this case, protrusions 6-5 and 6-6 are formed on the power source side electrode 4 such that the power source side electrode 4 has an area with a width that becomes larger toward the side close to signal lines 1-1 and 1-2. Widths of the protrusions 6-5 and 6-6 of the power source side electrode 4 are made larger than a width of a removal portion 9 from which a ground wiring is removed. As a result, the protrusions 6-5 and 6-6 of the power source side electrode 4 overlapping the ground wiring face the ground wiring to form a parallel plate capacitor, thereby forming a capacitive coupling part 6.

According to the present embodiment, a remarkable effect is obtained with a simple configuration in which only the power source side electrode 4 is the protrusions 6-5 and 6-6.

Seventh Embodiment

Figure 14:
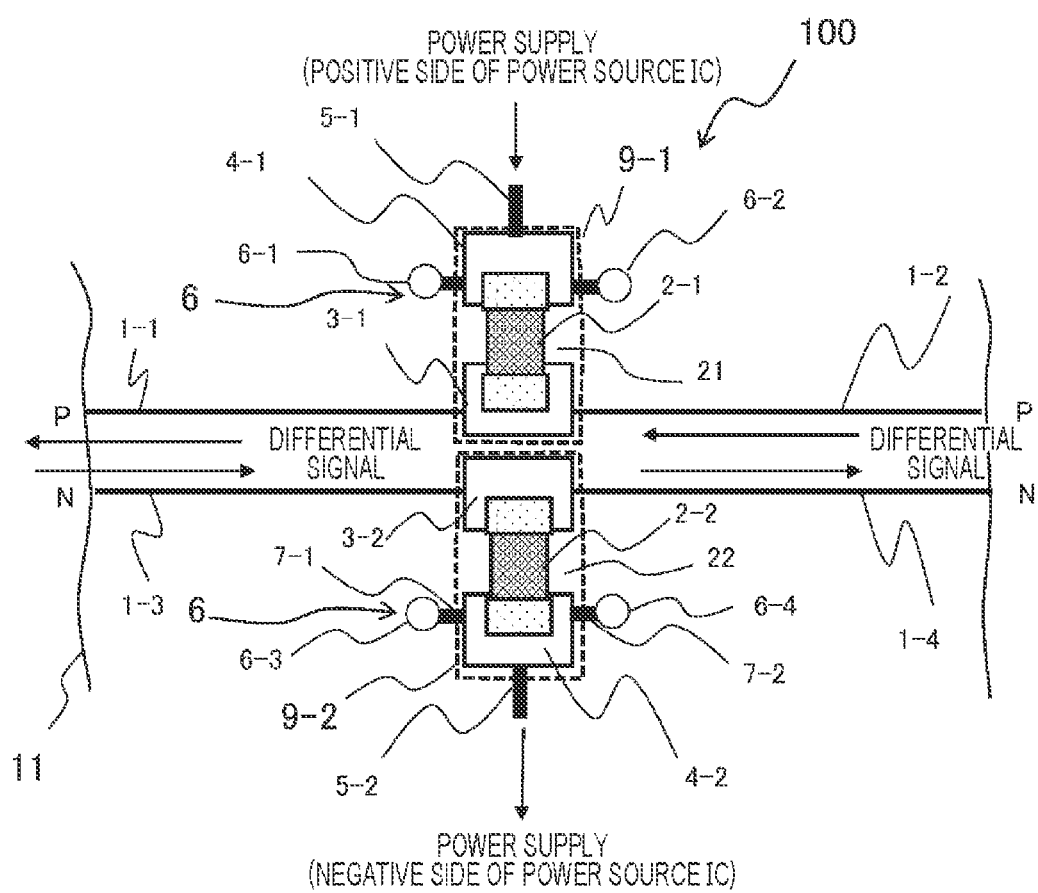
FIG. 14 is a diagram illustrating a configuration of a signal transmission device according to a seventh embodiment.

A seventh embodiment will be described with reference to FIG. 14. The same portions as those of the first embodiment are denoted by the same reference signs, and the description thereof will be omitted.

In the present embodiment, a signal transmission device 100 is utilized for superimposing power on a differential signal line, and as such a utilization form, for example, there is a power over data line (PoDL).

A filter component 21 including a signal side electrode 3-1, an electronic component 2-1, and a power source side electrode 4-1 is disposed on a substrate 11 in a removal portion 9-1 from which a ground wiring is removed. The signal side electrode 3-1 is connected to P-side wirings 1-1 and 1-2. Electrode patterns 6-1 and 6-2 provided on both sides of the power source side electrode 4-1 are arranged to face a ground wiring 8-1 (see FIG. 4) of the substrate 11. That is, the electrode patterns 6-1 and 6-2 function as a capacitive coupling part 6 that capacitively couples the power source side electrode 4-1 to the ground wiring 8-1.

A filter component 22 including a signal side electrode 3-2, an electronic component 2-2, and a power source side electrode 4-2 is disposed on the substrate 11 in a removal portion 9-2 from which the ground wiring is removed. The signal side electrode 3-2 is connected to N-side wirings 1-3 and 1-4. Electrode patterns 6-3 and 6-4 provided on both sides of the power source side electrode 4-2 are arranged to face the ground wiring 8-1 (see FIG. 4) of the substrate 11. That is, the electrode patterns 6-3 and 6-4 function as the capacitive coupling part 6 that capacitively couples the power source side electrode 4-2 to the ground wiring.

According to the present embodiment, the signal transmission device 100 can be used for superimposing power on the differential signal line.

Eighth Embodiment

An eighth embodiment will be described with reference to FIG. 15. The same portions as those of the first embodiment are denoted by the same reference signs, and the description thereof will be omitted.

The present embodiment is an example corresponding to PoDL for a higher frequency differential wiring. At a higher frequency, when individual filter components are used for P-side wirings 1-1 and 1-2 and N-side wirings 1-3 and 1-4, there is a possibility that a common mode component is generated due to a characteristic difference between the components due to variations in the filter components, so that a four-terminal single filter component 10 is utilized.

Figure 15:
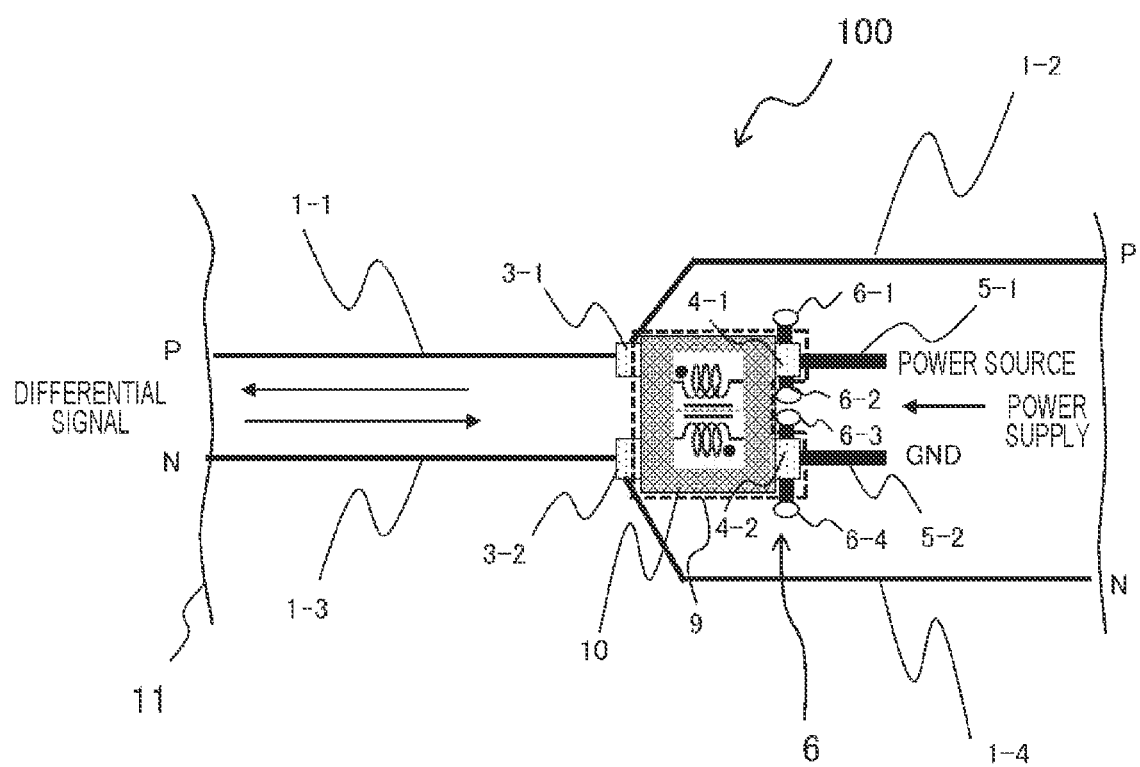
FIG. 15 is a diagram illustrating a configuration of a signal transmission device according to an eighth embodiment.

As illustrated in FIG. 15, the first signal line 1-1 connected to one side of a first electrode 3-1 and the second signal line 1-2 connected to the other side of the first electrode 3-1 are provided. Further, the third signal line 1-3 connected to one side of a second electrode 3-2 and the fourth signal line 1-4 connected to the other side of the second electrode 3-2 are provided. The first signal line 1-1 and the second signal line 1-2 are P-side wirings. The third signal line 1-3 and the fourth signal line 1-4 are N-side wirings.

The single filter component 10 is paired with the first electrode 3-1 and the second electrode 3-2 and includes a third electrode 4-1 and a fourth electrode 4-2 connected to the first electrode 3-1 and the second electrode 3-2 via an electronic component including at least an inductor component.

The single filter component 10 is disposed in a removal portion 9 from which a ground wiring is removed. First capacitive coupling parts 6-1 and 6-2 that capacitively couple the third electrode 4-1 to the ground wiring, and second capacitive coupling parts 6-3 and 6-4 that capacitively couple the fourth electrode 4-2 to the ground wiring are provided. The first capacitive coupling parts 6-1 and 6-2 provided on both sides of the third electrode 4-1 are arranged to face the ground wiring 8-1 (see FIG. 4) of the substrate 11, and capacitively couple the third electrode 4-1 to the ground wiring. The second capacitive coupling parts 6-3 and 6-4 provided on both sides of the fourth electrode 4-2 are arranged to face the ground wiring 8-1 (see FIG. 4) of the substrate 11, and capacitively couple the fourth electrode 4-2 to the ground wiring.

The first signal line 1-1 and the second signal line 1-2 constitute a first differential wiring, and the third signal line 1-3 and the fourth signal line 1-4 constitute a second differential wiring. Then, the first differential wiring and the first electrode 3-1, and the second differential wiring and the second electrode 3-2 form a transmission path for transmitting an electric signal, and the first differential wiring and the second differential wiring transmit power from the third electrode 4-1 and the fourth electrode 4-2 via the first electrode 3-1 and the second electrode 3-2.

In the present embodiment, an example in which one single filter component 10 is provided has been described, but a plurality of single filter components 10 may be connected in series and connected to power source wirings 5-1 and 5-2. In this case, the first-stage single filter component 10 connected to the first differential wiring and the second differential wiring includes the first capacitive coupling parts 6-1 and 6-2 and the second capacitive coupling parts 6-3 and 6-4, but the subsequent-stage single filter component 10 does not include a capacitive coupling part.

According to the present embodiment, since the single filter component 10 is used, it is possible to suppress the common mode component due to the inter-component characteristic difference due to a variation in the components as compared with the case of using a plurality of filter components 10.

Ninth Embodiment

Figure 16:
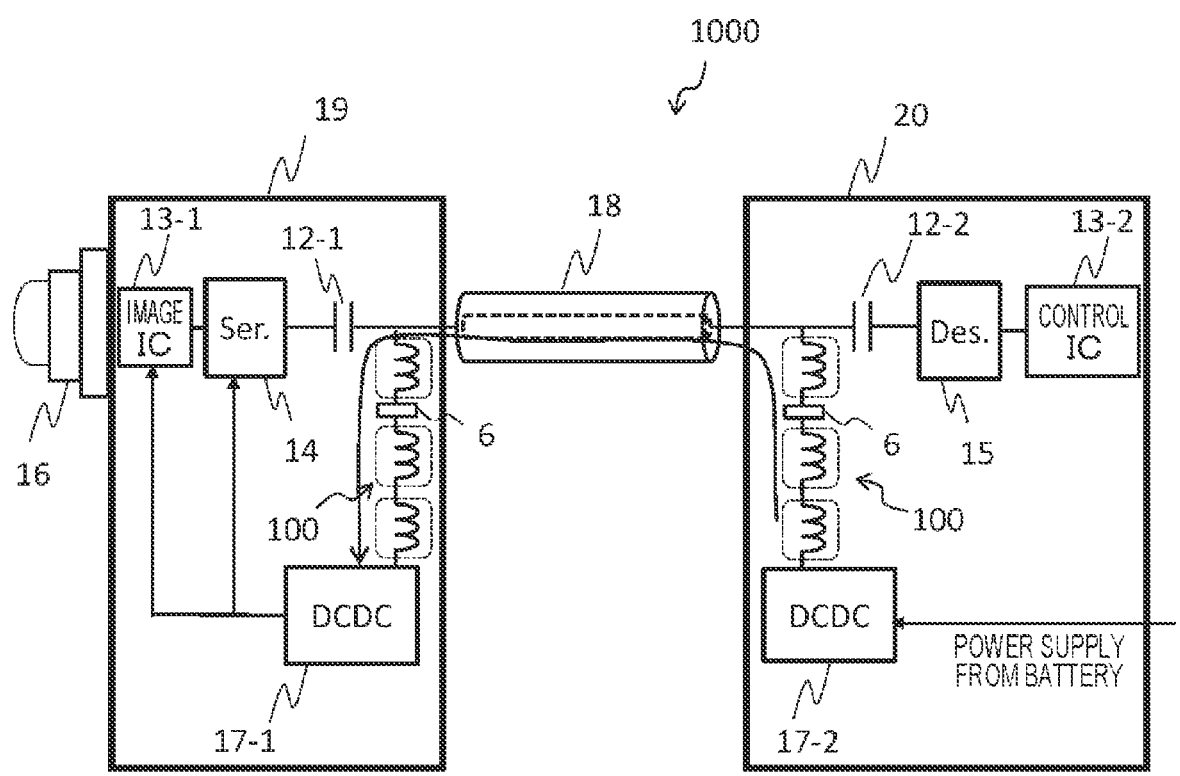
FIG. 16 is a diagram illustrating a configuration of a signal transmission circuit according to a ninth embodiment.

FIG. 16 is a diagram illustrating a configuration of a signal transmission circuit 1000. The signal transmission circuit 1000 according to the present embodiment is obtained by applying the signal transmission device 100 described in the first to eighth embodiments.

As illustrated in FIG. 16, the signal transmission circuit 1000 is configured by connecting a camera unit 19 to an ECU module 20 via a coaxial cable 18. Power is supplied from the ECU module 20 to the camera unit 19 using the coaxial cable 18, and a signal is mainly transmitted from the camera unit 19 to the ECU module 20 via the coaxial cable 18 at a high speed.

The camera unit 19 includes a camera 16, an image IC 13-1, a serializer 14, and a capacitor 12-1. Image data captured by the camera 16 is subjected to image processing by the image IC 13-1, converted into serial data by the serializer 14, and transmitted to the coaxial cable 18 via the capacitor 12-1 for direct current cut-off. On the other hand, the power supplied via the coaxial cable 18 is supplied to a DC-DC converter 17-1 via the signal transmission device 100. The DC-DC converter 17-1 supplies power to the camera 16, the image IC 13-1, and the serializer 14. The signal transmission device 100 includes the capacitive coupling part 6 described in each of the above-described embodiments.

The ECU module 20 includes a capacitor 12-2, a de-serializer 15, and a control IC 13-2. The signal transmitted to the ECU module 20 is transmitted to the de-serializer 15 via the capacitor 12-2 for direct current cut-off, converted into parallel data by the de-serializer 15, and input to the control IC 13-2. On the other hand, a DC-DC converter 17-2 receives power supplied from a battery or the like and supplies predetermined power to the coaxial cable 18 via the signal transmission device 100. The signal transmission device 100 includes the capacitive coupling part 6 described in each of the above-described embodiments.

According to the present embodiment, since the signal transmission device 100 including the capacitive coupling part 6 is used for both the camera unit 19 and the ECU module 20, for example, it is possible to implement 10 Gbps-class PoC-compatible high-speed communication.

Tenth Embodiment

Figure 17:
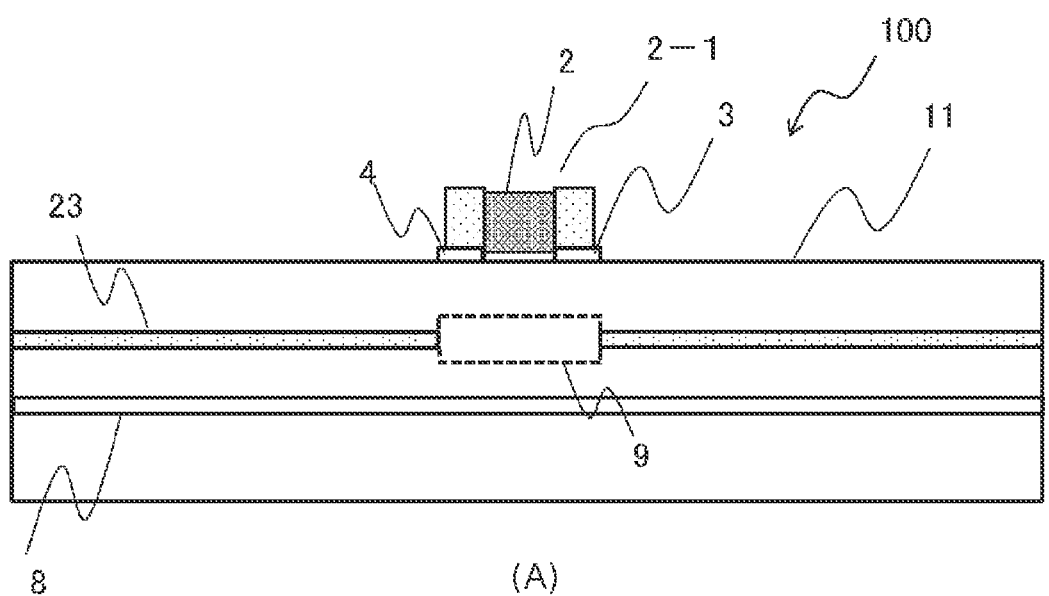
FIGS. 17(A) and 17(B) are cross-sectional views of a printed circuit board in a state where a filter component is disposed on a substrate according to a tenth embodiment.
Figure 17:
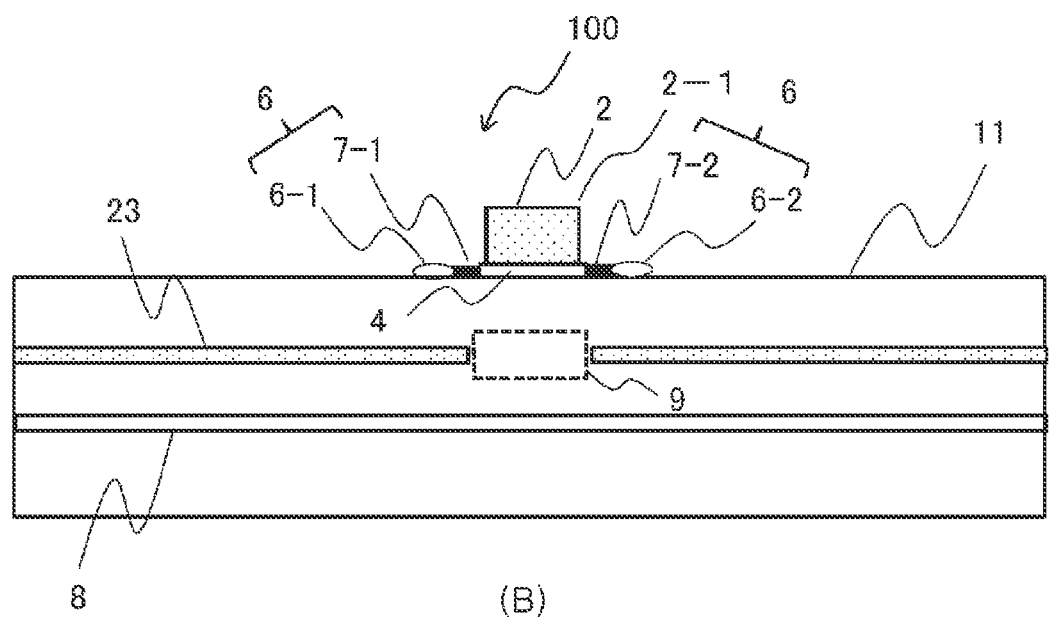

FIG. 17 are cross-sectional views of a state in which a filter component 2-1 is disposed on a substrate 11, FIG. 17(A) is a side view thereof, and FIG. 17(B) is a rear view thereof. The same portions as those of the first embodiment illustrated in FIG. 4 are denoted by the same reference signs, and the description thereof will be omitted. The tenth embodiment is different from the first embodiment in the configuration of the substrate 11 having a multilayer wiring structure.

As illustrated in FIG. 17(A), the surface layer of the substrate 11 is a surface on which a filter component 2-1 is mounted, and a power source wiring layer 23 is immediately below the surface layer. Furthermore, a ground wiring layer 8 is provided below the power source wiring layer 23. In the case of the substrate 11 having such a multilayer wiring structure, since the power source wiring layer 23 and the ground wiring layer 8 have a capacitance with a very large parallel plate, they are equivalent to being connected with low impedance at high frequencies. In the substrate 11 having such a configuration, even if a removal portion 9 from which a power source wiring is removed is provided immediately below the filter component 2-1, the same effects as those described in the first embodiment and the like can be obtained.

As illustrated in FIG. 17(B), the power source wiring layer 23 exists immediately below electrode patterns 6-1 and 6-2 provided on both sides of a power source side electrode 4. That is, the electrode patterns 6-1 and 6-2 function as a capacitive coupling part 6 by forming the parallel flat plate with the power source wiring layer 23.

The present embodiment can be similarly applied not only to the first embodiment but also to the second to ninth embodiments.

According to the present embodiment, it is possible to implement the signal transmission device 100 that covers a frequency range of more than 10 GHz that is difficult to reach only by a combination of filter components. Further, since the configuration can be implemented with only the pattern wiring of a printed wiring board, it is possible to achieve low cost, high density, and high performance. The signal transmission device 100 can be applied to various product fields in which power is superimposed on a signal line and transmitted, such as communication between a camera of an in-vehicle device and a control unit, as well as other information devices and infrastructure control devices.

According to the embodiments described above, the following operational effects can be obtained.

(1) A signal transmission device 100 includes: a signal side electrode 3; a first signal line 1-1 connected to one side of the signal side electrode 3; a second signal line 1-2 connected to the other side of the signal side electrode 3; a power source side electrode 4 that forms a pair with the signal side electrode 3 and is connected to the signal side electrode 3 via an electronic component 2 including at least an inductor component; and a capacitive coupling part 6 that capacitively couples the power source side electrode 4 to ground wirings 8-1 and 8-2 or a power source wiring 23. The first signal line 1-1, the signal side electrode 3, and the second signal line 1-2 form a transmission path for transmitting an electric signal, and the first signal line 1-1 and the second signal line 1-2 transmit power via the signal side electrode 3, the electronic component 2, and the power source side electrode 4. As a result, a filter frequency range can be widened to the high frequency side.

(2) A signal transmission device 100 includes: a first electrode 3-1; a first signal line 1-1 connected to one side of the first electrode 3-1; a second signal line 1-2 connected to the other side of the first electrode 3-1; a third signal line 1-3 connected to one side of a second electrode 3-2; a fourth signal line 1-4 connected to the other side of the second electrode 3-2; a third electrode 4-1 and a fourth electrode 4-2 that form a pair with the first electrode 3-1 and the second electrode 3-2 and are connected to the first electrode 3-1 and the second electrode 3-2 via an electronic component including at least an inductor component; and first capacitive coupling parts 6-1 and 6-2 that capacitively couple the third electrode 4-1 to a ground wiring or a power source wiring; and second capacitive coupling parts 6-3 and 6-4 that capacitively couple the fourth electrode 4-2 to the ground wiring or the power source wiring. The first signal line 1-1 and the second signal line 1-2 constitute a first differential wiring, the third signal line 1-3 and the fourth signal line 1-4 constitute a second differential wiring, the first differential wiring and the first electrode 3-1, and the second differential wiring and the second electrode 3-2 form a transmission path for transmitting an electric signal, and the first differential wiring and the second differential wiring transmit power from the third electrode 4-1 and the fourth electrode 4-2 via the first electrode 3-1 and the second electrode 3-2. As a result, a filter frequency range can be widened to the high frequency side.

The present invention is not limited to the above embodiments, and other forms conceivable within the scope of the technical idea of the present invention are also included within the scope of the present invention as long as the features of the present invention are not impaired. In addition, the above-described embodiments may be combined.

REFERENCE SIGNS LIST 1-1, 1-2 signal line
2, 2-1, 2-2, 2-3 filter component (electronic component)
3, 3-1, 3-2 signal side electrode
4, 4-1, 4-2 power source side electrode
5 power source wiring
6-1, 6-2, 6-3, 6-4 electrode pattern
6, 6-5, 6-6 capacitive coupling part
7-1, 7-2 wiring pattern
8-1, 8-2 ground wiring
9 removal portion from which ground wiring is removed or from which power source wiring is removed
11 substrate
12-1, 12-2 capacitor
13-1 image IC
13-2 control IC
14 serializer
15 de-serializer
16 camera
18 coaxial cable
19 camera unit
20 ECU module
22 filter component
23 power source wiring
100 signal transmission device
1000 signal transmission circuit

The invention claimed is:

1. A signal transmission device comprising:
a signal side electrode;
a first signal line connected to one side of the signal side electrode;
a second signal line connected to the other side of the signal side electrode;
a power source side electrode that forms a pair with the signal side electrode and is connected to the signal side electrode via an electronic component including at least an inductor component; and
a capacitive coupling part that capacitively couples the power source side electrode to a ground wiring or a power source wiring, wherein
the first signal line, the signal side electrode, and the second signal line form a transmission path for transmitting an electric signal, and the first signal line and the second signal line transmit power via the signal side electrode, the electronic component, and the power source side electrode.

2. The signal transmission device according to claim 1, wherein the capacitive coupling part includes: a first capacitive coupling part that is provided on an outer side of a connection point between the signal side electrode and the first signal line and capacitively couples the power source side electrode to the ground wiring or the power source wiring; and a second capacitive coupling part that is provided on an outer side of a connection point between the signal side electrode and the second signal line and capacitively couples the power source side electrode to the ground wiring or the power source wiring.

3. The signal transmission device according to claim 2, wherein each of the first capacitive coupling part and the second capacitive coupling part includes an electrode pattern facing the ground wiring or the power source wiring.

4. The signal transmission device according to claim 3, wherein the electrode pattern is connected to the power supply side electrode by a wiring pattern thinner than the electrode pattern.

5. The signal transmission device according to claim 4, wherein each of the first capacitive coupling part and the second capacitive coupling part includes a plurality of the electrode patterns and a plurality of the wiring patterns connecting the electrode patterns.

6. The signal transmission device according to claim 2, wherein each of the first capacitive coupling part and the second capacitive coupling part is formed by making a width of the power source side electrode larger than a width of the signal side electrode.

7. The signal transmission device according to claim 6, wherein the first capacitive coupling part and the second capacitive coupling part are formed by setting a shape of the power source side electrode to a trapezoidal shape in which the power source side electrode has a width that becomes larger toward wiring sides of the first signal line and the second signal line.

8. The signal transmission device according to claim 6, wherein the first capacitive coupling part and the second capacitive coupling part are formed by protrusions that are on both sides of the power source side electrode and have a width that becomes larger toward wiring sides of the first signal line and the second signal line.

9. The signal transmission device according to claim 2, wherein
each of the first capacitive coupling part and the second capacitive coupling part includes:
a removal portion from which the ground wiring or the power source wiring immediately below the power source side electrode is removed is narrower than a removal portion from which the ground wiring or the power source wiring immediately below the signal side electrode is removed.

10. The signal transmission device according to claim 1, wherein the first signal line and the second signal line form a differential wiring.

11. A signal transmission circuit that connects a camera to an electronic control module via a coaxial cable, the signal transmission circuit comprising the signal transmission device according to claim 1, wherein the signal transmission device is configured to supply power from the electronic control module to the camera via the coaxial cable, perform signal communication between the camera and the electronic control module via the coaxial cable, and perform the signal communication and the power supply on at least one substrate of the camera and the electronic control module.

12. A signal transmission device comprising:
a first electrode;
a first signal line connected to one side of the first electrode;
a second signal line connected to the other side of the first electrode;
a second electrode;
a third signal line connected to one side of the second electrode;
a fourth signal line connected to the other side of the second electrode;
a third electrode and a fourth electrode that form a pair with the first electrode and the second electrode and are connected to the first electrode and the second electrode via an electronic component including at least an inductor component;
a first capacitive coupling part that capacitively couples the third electrode to a ground wiring or a power source wiring; and a second capacitive coupling part that capacitively couples the fourth electrode to the ground wiring or the power source wiring, wherein the first signal line and the second signal line constitute a first differential wiring, the third signal line and the fourth signal line constitute a second differential wiring, the first differential wiring and the first electrode, and the second differential wiring and the second electrode form a transmission path for transmitting an electric signal, and the first differential wiring and the second differential wiring transmit power from the third electrode and the fourth electrode via the first electrode and the second electrode.

* * * * *